US010861726B2

(12) United States Patent
Tsai et al.

(10) Patent No.: US 10,861,726 B2
(45) Date of Patent: Dec. 8, 2020

(54) APPARATUS AND METHOD FOR MEASURING WARPAGE

(71) Applicant: Advanced Semiconductor Engineering, Inc., Kaohsiung (TW)

(72) Inventors: Chun Hung Tsai, Kaohsiung (TW); Hsuan Yu Chen, Kaohsiung (TW); Ian Hu, Kaohsiung (TW); Meng-Kai Shih, Kaohsiung (TW); Shin-Luh Tarng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 154 days.

(21) Appl. No.: 16/138,938

(22) Filed: Sep. 21, 2018

(65) Prior Publication Data

US 2020/0098605 A1    Mar. 26, 2020

(51) Int. Cl.
*H01L 21/67* (2006.01)
*G01N 21/95* (2006.01)
*G06T 7/00* (2017.01)
*G01B 11/25* (2006.01)
*G01N 21/956* (2006.01)

(52) U.S. Cl.
CPC ........ *H01L 21/67288* (2013.01); *G01B 11/25* (2013.01); *G01N 21/9501* (2013.01); *G01N 21/956* (2013.01); *G06T 7/001* (2013.01); G06T 2207/30148 (2013.01)

(58) Field of Classification Search
CPC .............. H01L 21/67288; G01B 11/25; G01N 21/9501; G01N 21/956; G06T 7/001
See application file for complete search history.

(56) References Cited

U.S. PATENT DOCUMENTS

| 6,564,166 | B1* | 5/2003 | Ume | G01B 11/25 702/136 |
| 9,891,048 | B2 | 2/2018 | Park et al. | |
| 2007/0146685 | A1* | 6/2007 | Yoo | G01N 21/95607 356/32 |
| 2010/0321677 | A1* | 12/2010 | Fukazawa | G01N 21/956 356/237.2 |
| 2011/0188734 | A1* | 8/2011 | Tsuchiya | G06T 7/0002 382/149 |
| 2011/0310229 | A1* | 12/2011 | Ueda | G01B 11/2545 348/46 |

(Continued)

OTHER PUBLICATIONS

Niu, Yuling, Hohyung Lee, and Seungbae Park. "A new in-situ warpage measurement of a wafer with speckle-free digital image correlation (DIC) method." 2015 IEEE 65th Electronic Components and Technology Conference (ECTC). IEEE, 2015. (Year: 2015).*

*Primary Examiner* — Utpal D Shah
(74) *Attorney, Agent, or Firm* — Foley & Lardner LLP

(57) ABSTRACT

An apparatus includes: a first image capture module, a second image capture module, and a first projector. The first image capture module has a first optical axis forming an angle from approximately 70° to approximately 87° with respect to the surface of a carrier. The second image capture module has a first optical axis forming an angle of approximately 90° with respect to the surface of the carrier. The first projector has a first optical axis forming an angle from approximately 40° to approximately 85° with respect to the surface of the carrier.

27 Claims, 17 Drawing Sheets

(56) References Cited

U.S. PATENT DOCUMENTS

| | | | |
|---|---|---|---|
| 2012/0229618 A1* | 9/2012 | Urano | G06T 7/0004 |
| | | | 348/92 |
| 2015/0022812 A1* | 1/2015 | Ogawa | G01N 21/21 |
| | | | 356/364 |
| 2019/0228522 A1* | 7/2019 | Shinoda | G06N 3/0454 |
| 2020/0080202 A1* | 3/2020 | Akashi | C23C 16/46 |
| 2020/0096321 A1* | 3/2020 | Hisano | G06T 7/50 |

* cited by examiner

APPARATUS AND METHOD FOR MEASURING WARPAGE

TECHNICAL FIELD

The subject application relates generally to an apparatus and method for measuring warpage, and more particularly to an apparatus and method for observing warpage.

BACKGROUND

Warpage is an issue during the manufacture of a semiconductor device package. Geometric/positional information of the semiconductor device package is measured or obtained to determine warpage. In order to obtain geometric information of the semiconductor device package, a camera may be used to capture an image(s) of the semiconductor device package, on which a pattern (made by ink, paint or the like) is applied. However, the pattern may remain on the semiconductor device package even if a cleaning operation is performed, which results in contamination that may adversely affect the performance of the semiconductor device package (e.g. poor electrical/thermal conductivity, open circuit, and so forth).

SUMMARY

An embodiment of the subject application is related to an apparatus, comprising: a first image capture module, a second image capture module, and a first projector. The first image capture module has a first optical axis forming an angle from approximately 70° to approximately 87° with respect to the surface of a carrier. The second image capture module has a first optical axis forming an angle of approximately 90° with respect to the surface of the carrier. The first projector has a first optical axis forming an angle from approximately 40° to approximately 85° with respect to the surface of the carrier.

Another embodiment of the subject application is related to an apparatus, comprising: a first projector, a first image capture module, and a second image capture module. The first projector has a first projection range. The first image capture module is disposed out of the first projection range of the first projector, and has a first field of view. The second capture module is disposed out of the first field of view of the first image capture module, and out of the first projection range of the first projector.

A further embodiment of the subject application is related to a method for measuring a to-be-measured object. The method comprises: (1) projecting a first pattern on a reference object disposed on a carrier using a first projector; (2) capturing a first reference image of the entire reference object using a first image capture module; (3) projecting the first pattern on an object disposed on the carrier using the first projector; (4) capturing a first measurement image of the entire object using the first image capture module; (5) correlating the first reference image with the first measurement image to obtain a global correlation image; and (6) determining the warpage of the object based on the global correlation image.

It should be noted that the above descriptions are merely examples of the embodiments of the subject application. Effects of the embodiments of the subject application are not limited to the effects described here, and may be different from the effects described here, or may further include any other effects.

It is to be understood that both the foregoing general description and the following detailed description are exemplary, and are intended to provide further explanation of the embodiments claimed herein.

BRIEF DESCRIPTION OF THE DRAWINGS

The accompanying drawings are included to provide a further understanding of the embodiments claimed herein, and are incorporated into and constitute a part of this specification. The drawings illustrate embodiments and, together with the specification, serve to explain the principles of the technology involved.

DETAILED DESCRIPTION

Some embodiments of the subject application will be described in detail below referring to the accompanying drawings.

Figure 1:
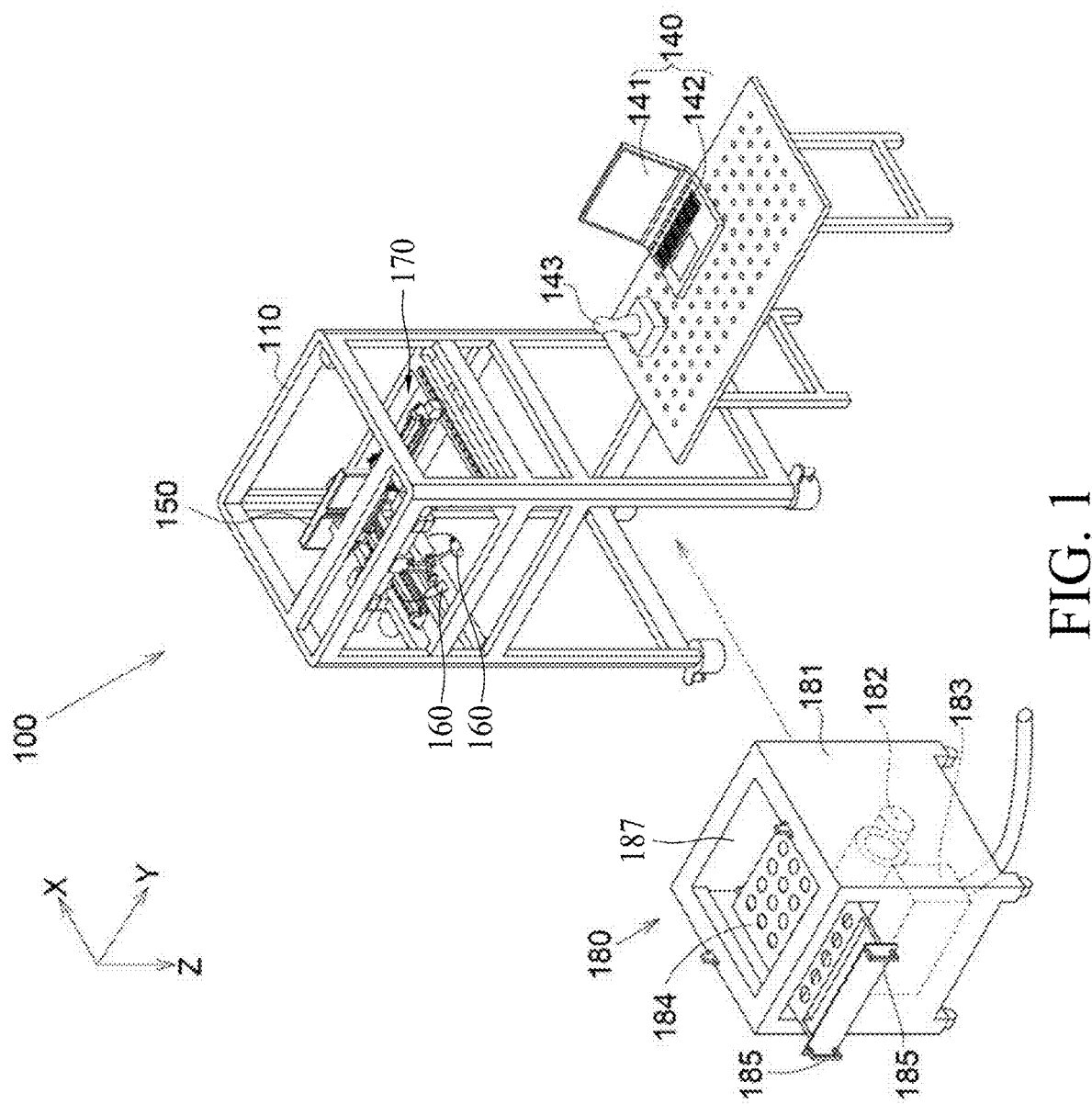
FIG. 1 illustrates a perspective view of an apparatus according to some embodiments of the subject application.

Referring to FIG. 1, a perspective view of an apparatus according to some embodiments of the subject application is illustrated. The apparatus 100 includes a rack 110, image capture modules 120 and 130, a processing device 140 (e.g., a computer), a projector 150, a plurality of light emitting devices 160, a motorized linear stage 170, and a temperature-adjustable container 180.

Figure 2:
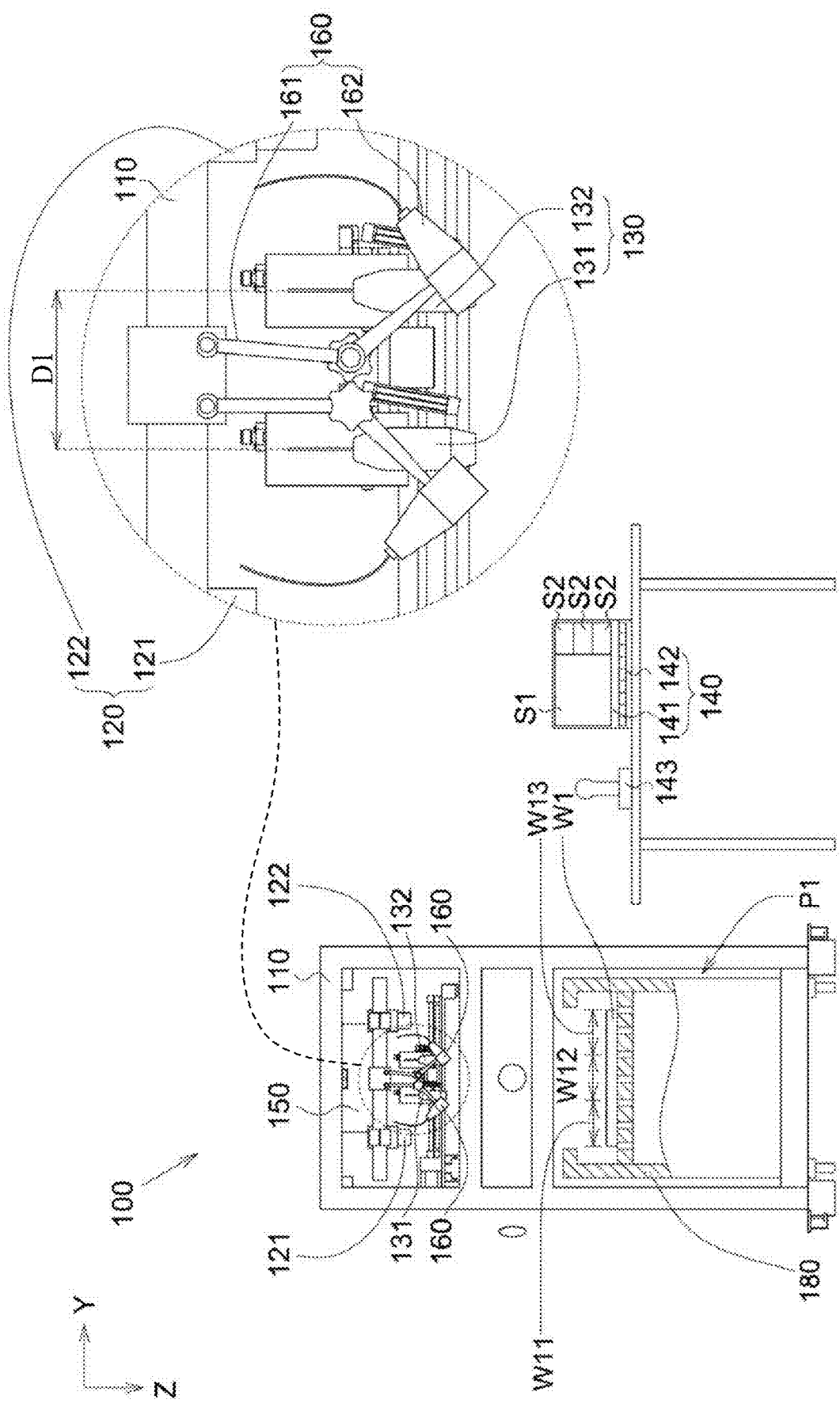
FIG. 2 illustrates a front view of the apparatus shown in FIG. 1.

Referring to FIG. 2, a front view of the apparatus shown in FIG. 1 is illustrated. The elevation of the image capture module 120 is greater than the elevation of the image capture module 130. The image capture module 120 can capture an image of the entire object W1, such as a semiconductor wafer, a panel, a strip, or a unit, for analyzing the deformation of the entire object W1. The image capture module 120 includes image capture devices 121 and 122. The image capture devices 121 and 122 are fixedly disposed on the rack 110. The size of the entire object W1 is within 500 mm×500 mm, or larger than 500 mm×500 mm, according to some embodiments of the subject application. In some embodiments of the subject application, the image capture devices 121 and 122 can be, for example, five-megapixel digital cameras; however, such exemplification is not meant to be limiting.

The to-be-measured object W1 comprises a plurality of local areas W11, W12, and W13. The image capture module 130 can capture a plurality of images of the local areas W11, W12 and W13 of the object W1 for analyzing a plurality of deformations of the local areas W11, W12 and W13. In other words, the image capture module 130 can capture an image of a part (W11, W12, or W13) of the object W1. The image capture module 130 includes image capture devices 131 and 132. The image capture devices 131 and 132 can capture local images of the local areas W11, W12, and W13. According to some embodiments of the subject application, the local area W11, W12, or W13 to be measured should occupy one-ninth to one-quarter of the corresponding local image. If the number of pixels is fixed (e.g., 5 mega pixels), the smaller the size of the image is, the larger the resolution of the local image will be. Since each local image S2 of the local areas W11, W12, and W13 is smaller than the entire image of the object W1, the resolution of the local image S2 is larger than that of the entire image S1. Accordingly, the accuracy and precision of analyzing the deformation of the object W1 can be improved. In some embodiments, the image capture devices 131 and 132 can be, for example, five-megapixel digital cameras; however, such exemplification is not meant to be limiting.

To prevent the local images captured by the image capture devices 131 and 132 from being out of focus, there is an interval D1 between the image capture devices 131 and 132. In some embodiments, the interval D1 between the image capture devices 131 and 132 ranges between 100 and 160 millimeters; however, such exemplification is not meant to be limiting.

Before the deformation of the object W1 is analyzed, a plurality of paint spots could be distributed onto the object W1. Then, the object W1 is disposed within the temperature-adjustable container 180 to be heated or cooled, and thus the object W1 is deformed due to the variation in temperature. After this, the image capture module 120 captures a global image of the entire object W1, and the image capture module 130 captures local images simultaneously. Subsequently, the processing device 140 can analyze the entire image, and the local images have a higher resolution to obtain deformation profiles of the object W1 in the x-y plane (in-plane deformation of the object W1), the y-z plane (warpage of the object W1), and the xz plane (warpage of the object W1).

The processing device 140 includes a display device 141 and a control component 142. The display device 141 is electrically connected to the image capture modules 120 and 130, and the display device 141 displays the entire image, the local images, and the deformation profiles of the object W1. The control component 142, such as a keyboard, is electrically connected to the motorized linear stage 170 for the purpose of controlling the motorized linear stage 170 to drive the image capture module 130 to move in the x-axis and y-axis. The x-axis and y-axis are orthogonal to each other. Accordingly, the image capture module 130 can be controlled to capture any desired local images of local areas W11, W12 and W13.

In another embodiment, the apparatus 100 further includes a joystick 143 electrically connected to the motorized linear stage 170. The joystick 143 is electrically connected to the motorized linear stage 170 for the purpose of controlling the motorized linear stage 170 to drive the image capture module 130 to move in the x-axis and y-axis. The x-axis and y-axis are orthogonal to each other. Accordingly, the image capture module 130 can be controlled to capture any desired local images of local areas W11, W12 and W13.

The light emitting devices 160 can illuminate the object W1 to make the entire image and the local images clear. Each light emitting device 160 is pivotally connected to the rack 110, and thus the light-emitting direction (e.g., the optical axis) can be adjusted. Each light emitting device 160 includes an adjustable component 161 and a light-emitting component 162. The adjustable component 161 is pivotally connected to the rack 110 such that the adjustable component 161 can rotate with respect to the rack 110. The light-emitting component 162 is pivotally connected to the adjustable component 161 such that the light-emitting component 162 can rotate with respect to the adjustable component 161, and accordingly the motion range of the light emitting device 160 can be expanded. However, in some embodiments, the apparatus 100 may not include the light emitting devices 160.

Figure 3:
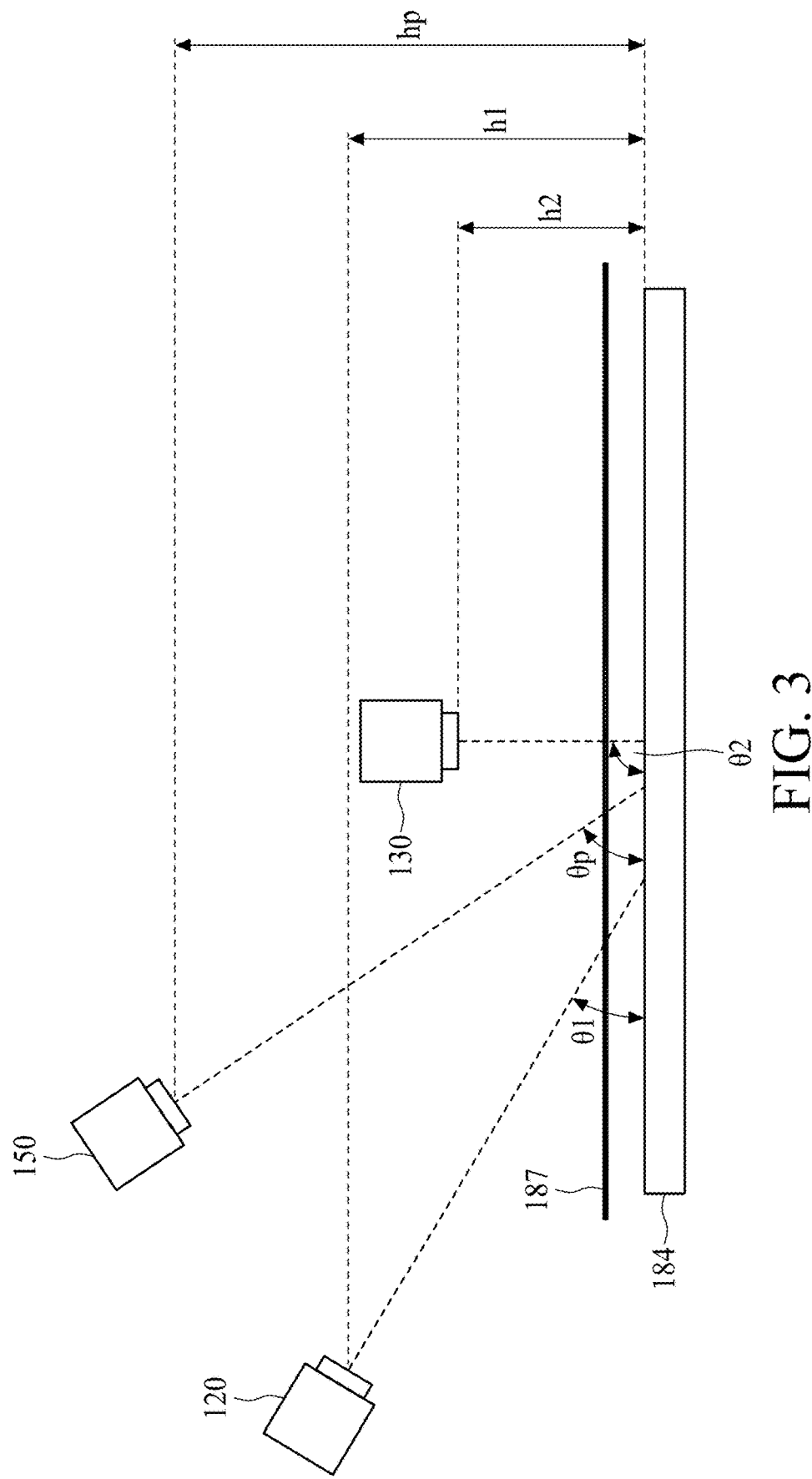
FIG. 3 illustrates a part of the apparatus shown in FIG. 1 and an object to be measured according to some embodiments of the subject application.

FIG. 3 illustrates a part of the apparatus shown in FIG. 1 and an object W1 according to some embodiments of the subject application. FIG. 3 comprises the image capture modules 120 and 130 and the projector 150. FIG. 3 shows a transparent panel 187 (e.g., a glass panel) and a carrier 184 of the temperature-adjustable container 180, in which the transparent panel 187 is over the carrier 184. In some embodiments, an anti-reflection layer is disposed on the transparent panel 187. The image capture module 120 has an optical axis forming an angle θ1 from approximately 70° to approximately 87° with respect to a surface of the carrier 184. The image capture module 130 has an optical axis forming an angle θ2 of approximately 90° with respect to the surface of the carrier 184. The projector 150 has an optical axis forming an angle θp from approximately 40° to approximately 85° with respect to the surface of the carrier 184. In some embodiments, the image capture module 120 has an elevation h1 from the transparent panel 187, the image capture module 130 has an elevation h2 from the transparent panel 187, and the projector 150 has an elevation hp from the transparent panel 187. The elevation h1 of the capture module 120 is greater than the elevation h2 of the image capture module 130. The elevation hp of the projector 150 is greater than the elevation h1 of the image capture module 120.

Figure 4:
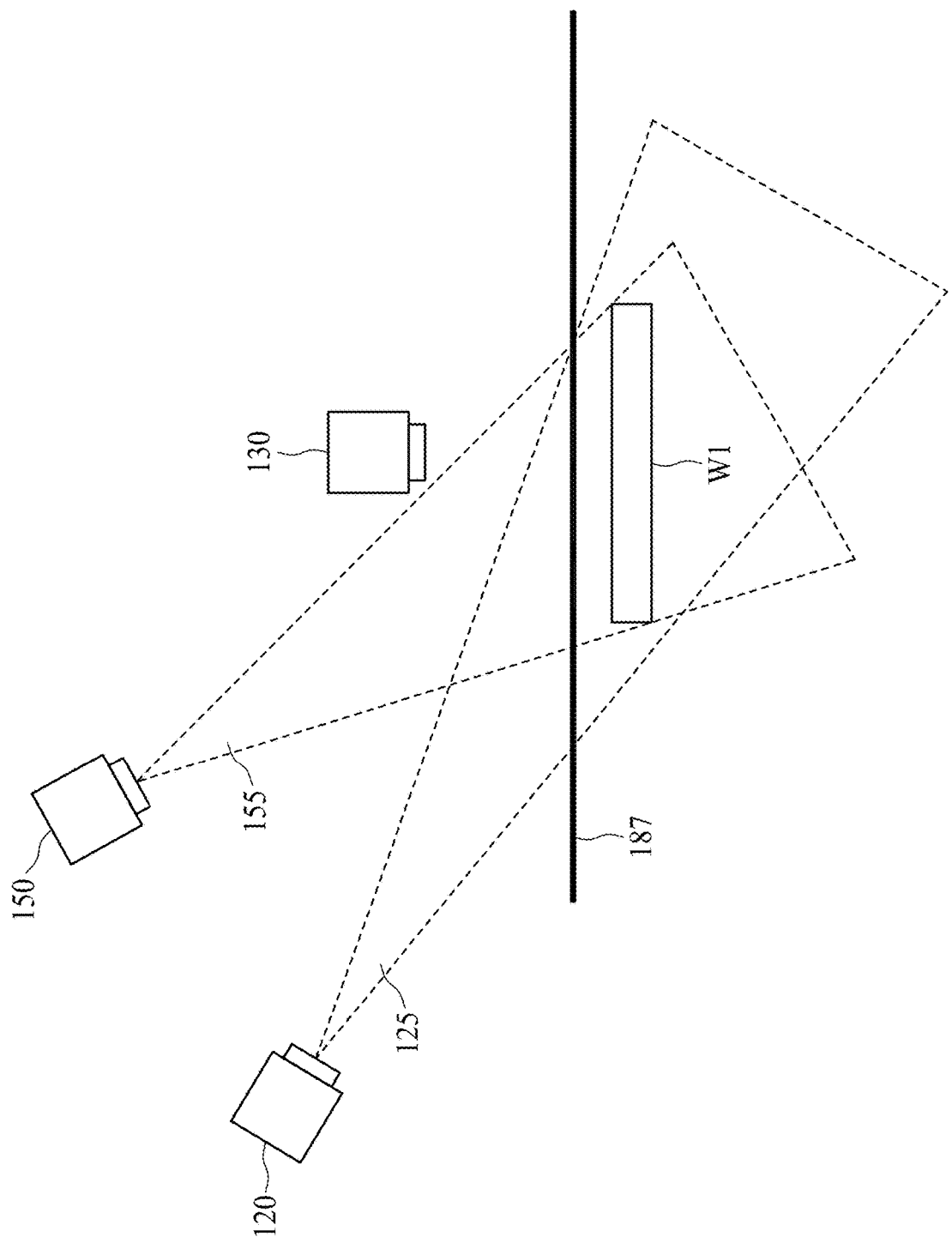
FIG. 4 illustrates a part of the apparatus shown in FIG. 1 and an object to be measured according to some other embodiments of the subject application.

FIG. 4 illustrates a part of the apparatus shown in FIG. 1 and an object W1 according to some embodiments of the subject application. FIG. 4 comprises the image capture modules 120 and 130 and the projector 150. FIG. 4 shows a transparent panel 187 (e.g., a transparent glass panel) and a carrier 184 of the temperature-adjustable container 180, in which the transparent panel 187 is over the carrier 184. In some embodiments, an anti-reflection layer is disposed on the transparent panel 187. The projector 150 has a projection range 155. The image capture module 120 is disposed out of the projection range 155 of the projector 150. The image capture module 120 has a field of view 125. The image capture module 130 is disposed out of the field of view 125 of the image capture module 120 and out of the projection range 155 of the projector 150.

Figure 5:
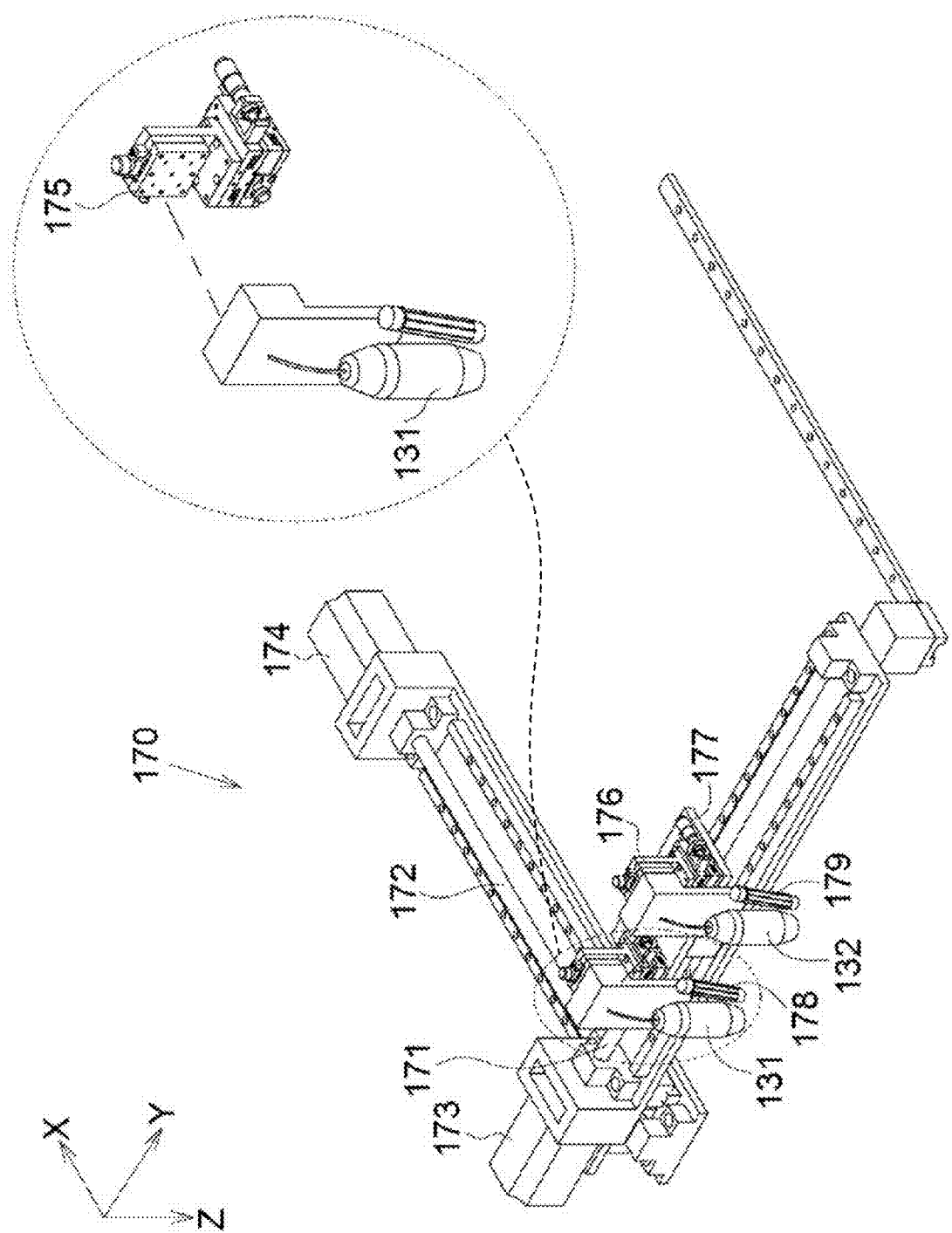
FIG. 5 illustrates a motor driven linear stage driving device as shown in FIG. 1.

FIG. 5 is illustrates a perspective view of the motorized linear stage 170 shown in FIG. 1. In some embodiments of the apparatus 100, for example, the stroke is 500 mm, the maximum feed force is 200N, the maximum speed is 300 rpm, the repetition accuracy is +/−0.02 mm, and the time of reaction is less than 0.01 second. However, such exemplification is not meant to be limiting. The motorized linear stage 170 is controlled by the control component 142 or the joystick 143 to drive the image capture module 130 to move to capture the local images of the local area W11, W12, and W13 of the object W1 for the purpose of analyzing the local deformations of the local areas W11, W12 and W13.

The motorized linear stage 170 includes rails 171 and 172, and linear motors 173 and 174. The rail 171 extends along a first sliding direction, such as the y-axis, and can be driven to rotate by the linear motor 173 such that the image capture module 130 (including image capture devices 131 and 132) can move along the rail 171. The rail 172 extends along a second sliding direction, such as the x-axis, and can be driven to rotate by the linear motor 174 such that the image capture module 130 can move along the rail 172. The rail 171 is movably disposed on the rail 172 such that the image capture module 130 can move along the first and second sliding directions using the rails 171 and 172.

The motorized linear stage 170 further includes bases 175 and 176 and a carrier 177. The image capture device 131 is fixedly disposed on the base 175 using a plurality of screws. The base 175 is fixedly disposed on the carrier 177 using a plurality of screws (not illustrated) such that the image capture device 131 is fixedly disposed on the carrier 177 through the base 175. Similarly, the image capture device 132 is fixedly disposed on the base 176 using a plurality of screws (not illustrated). The base 176 is fixedly disposed on the carrier 177 using a plurality of screws (not illustrated) such that the image capture device 132 is fixedly disposed on the carrier 177 through the base 176. The carrier 177 is movably disposed on the first rail 171 such that the image capture module 130 (including image capture devices 131 and 132) can be driven by the carrier 177.

The motorized linear stage 170 further includes position marking components 178 and 179, such as laser emitting components. Laser light emitted by the position marking components 178 and 179 can be focused on a visible light-point (not illustrated) in the to-be-measured object W1. Accordingly, the positions of the image capture devices 131 and 132 can be confirmed through the visible light-point.

Figure 6:
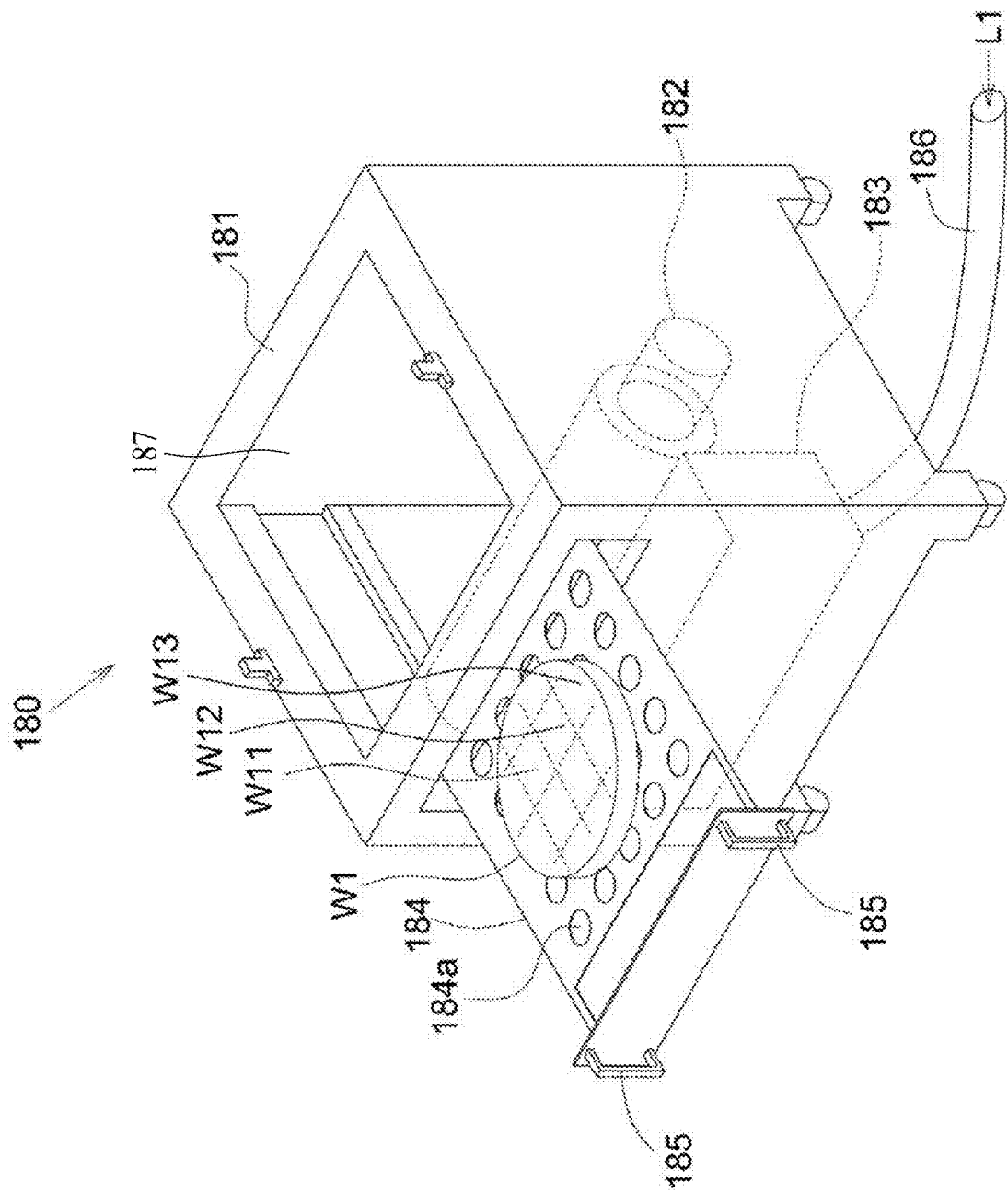
FIG. 6 illustrates a temperature-adjustable container as shown in FIG.

Referring to FIG. 6, a perspective view of the temperature-adjustable container 180 of FIG. 1 is illustrated. The temperature-adjustable container 180 is disposed within a space P1 (illustrated in FIG. 2) below the image capture module 130 (not illustrated in FIG. 2). The temperature-adjustable container 180 can accommodate the object W1. The temperature-adjustable container 180 includes a casing 181, a heater 182, a cooler 183, a carrier 184, a plurality of handles 185, a tube 186, and a transparent panel 187 (e.g., a transparent glass panel). The heater 182 is disposed within the casing 181 for heating the object W1 carried by the carrier 184. The cooler 183 is disposed within the casing 181 for cooling the object W1 carried by the carrier 184. In addition, liquid nitrogen L1 can be transmitted to the cooler 183 through the tube 186 for cooling the object W1. The heater 182 and the cooler 183 can be controlled by the processing device 140 (illustrated in FIG. 2) to create a manufacturing temperature ranging between −55 degrees centigrade and 300 degrees centigrade for analyzing the deformation of the object W1. The carrier 184 has a plurality of through holes 184a, and the heat or cooling air can be convected to the object W1 via the through holes 184a.

The carrier 184 is withdrawably disposed on the casing 181. The handles 185 are disposed on the casing 181. It is convenient to hold the handles 185 to pull out or retract the carrier 184. When the carrier 184 is pulled out of the casing 181, the object W1 can be disposed on the carrier 184. Since the carrier 184 is withdrawably disposed on the casing 181, the carrier 184 carrying the object W1 can be retracted within the casing 181.

Figure 7B:
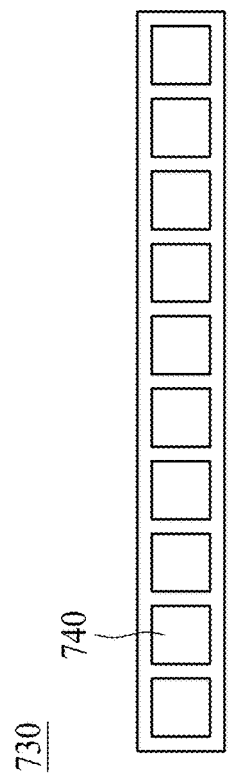
FIG. 7B illustrates a top view of a panel according to some embodiments of the subject application.
Figure 7D:
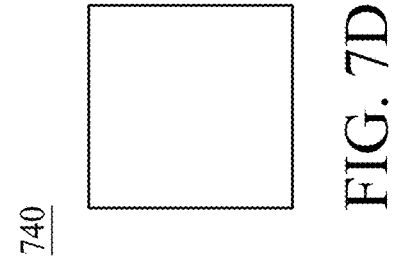
FIG. 7D illustrates a top view of a unit according to some embodiments of the subject application.
Figure 7A:
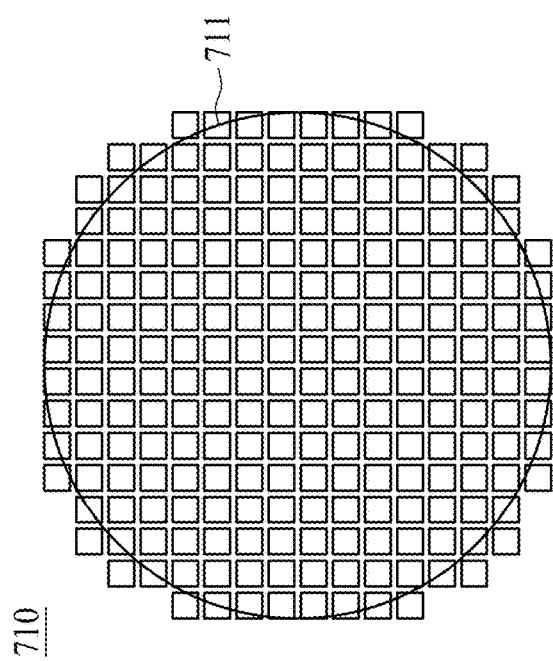
FIG. 7A illustrates a top view of a semiconductor wafer according to some embodiments of the subject application.
Figure 7C:
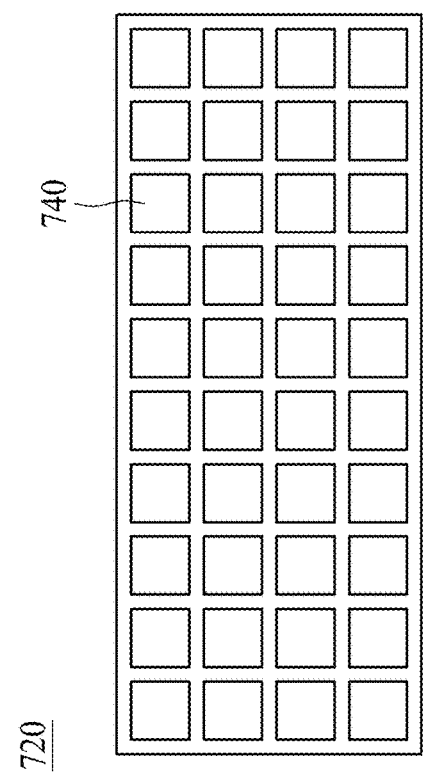
FIG. 7C illustrates a top view of a strip according to some embodiments of the subject application.

FIG. 7A illustrates a top view of a semiconductor wafer 710. FIG. 7B illustrates a top view of a panel 720. FIG. 7C illustrates a top view of a strip 730. FIG. 7D illustrates a top view of a unit 740. In FIG. 7A, the semiconductor wafer 710 comprises a plurality of dies 711. In FIG. 7B, the panel 720 comprises an array of units 740. In FIG. 7C, the strip 730 comprises a row of units 740. The unit 740 may be a packaged chip having a plurality of pins. The object W1 to be measured in the apparatus 100 may be the semiconductor wafer 710, the panel 720, the strip 730, or the unit 740.

In another embodiment, the projector 150 can project a pattern toward the carrier 184, and the pattern is thus projected onto the object W1. In this way, paint spots distributed onto the object W1 may be omitted. The pattern projected on the object W1 comprises virtual or optical patterns, and thus the pollution of particles on the object W1 can be avoided.

Figure 8D:
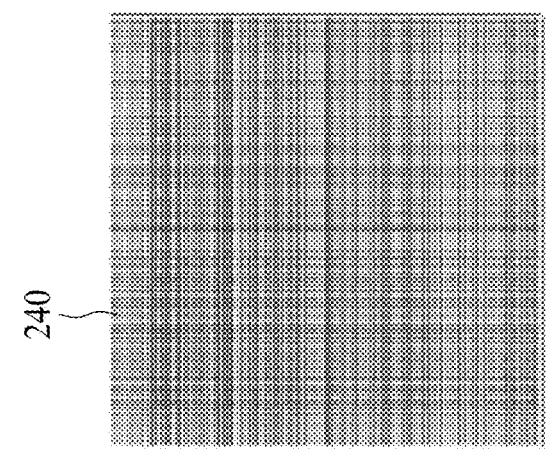
FIG. 8D illustrates a pattern projected by a projector according to some embodiments of the subject application.
Figure 8C:
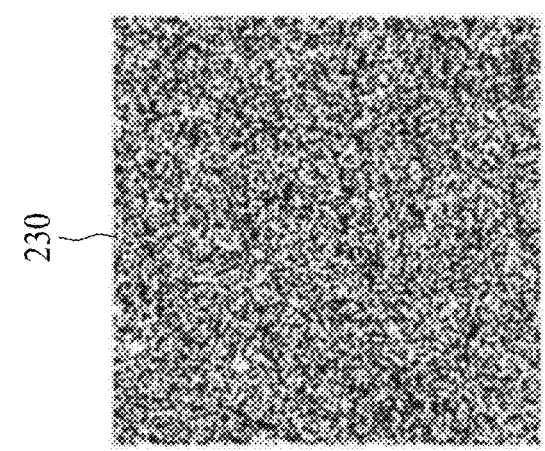
FIG. 8C illustrates a pattern projected by a projector according to some embodiments of the subject application.
Figure 8B:
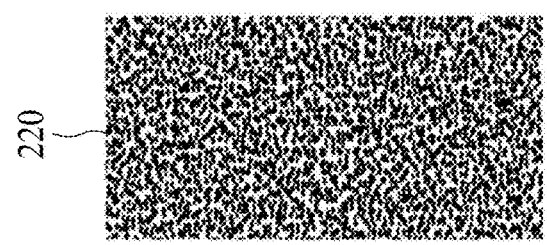
FIG. 8B illustrates a pattern projected by a projector according to some embodiments of the subject application.
Figure 8A:
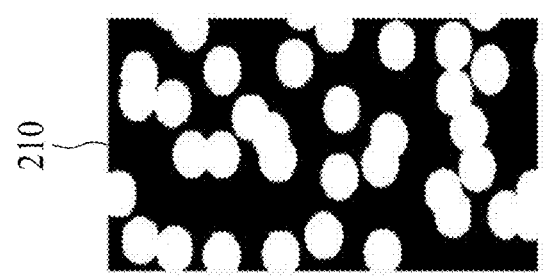
FIG. 8A illustrates a pattern projected by a projector according to some embodiments of the subject application.

FIGS. 8A and 8B illustrate patterns 210 and 220 which may be projected by the projector 150. The patterns 210 and 220 both comprise irregular spots. The spots of the pattern 210 have a diameter greater than that of the spots of the pattern 220. The density of the spots of the pattern 210 is greater than that of the spots of the pattern 220. Because of the differences between the patterns 210 and 220, the pattern 210 is suitable for measuring the entire object W1, whereas the pattern 220 is suitable for measuring a part (W11, W12, or W13) of the object W1. In a preferred embodiment, the resolution of the pattern projected by the projector 150 is greater than 1920 by 1080 pixels (e.g., 1080P).

FIGS. 8C and 8D illustrate patterns 230 and 240. The pattern 230 is similar to the pattern 220. In some embodiments, when the pattern 230 is projected by the projector 150, the pattern 240 may be simultaneously projected by another projector 150-1. The pattern 240 may consist of irregular vertical and horizontal lines, or may consist of spots. By simultaneously projecting two different patterns, the accuracy of measuring the warpage of the object W1 may be improved. In a preferred embodiment, the resolution of the pattern projected by the projectors 150 and 150-1 is greater than 1920 by 1080 pixels (e.g., 1080P).

Figure 9:
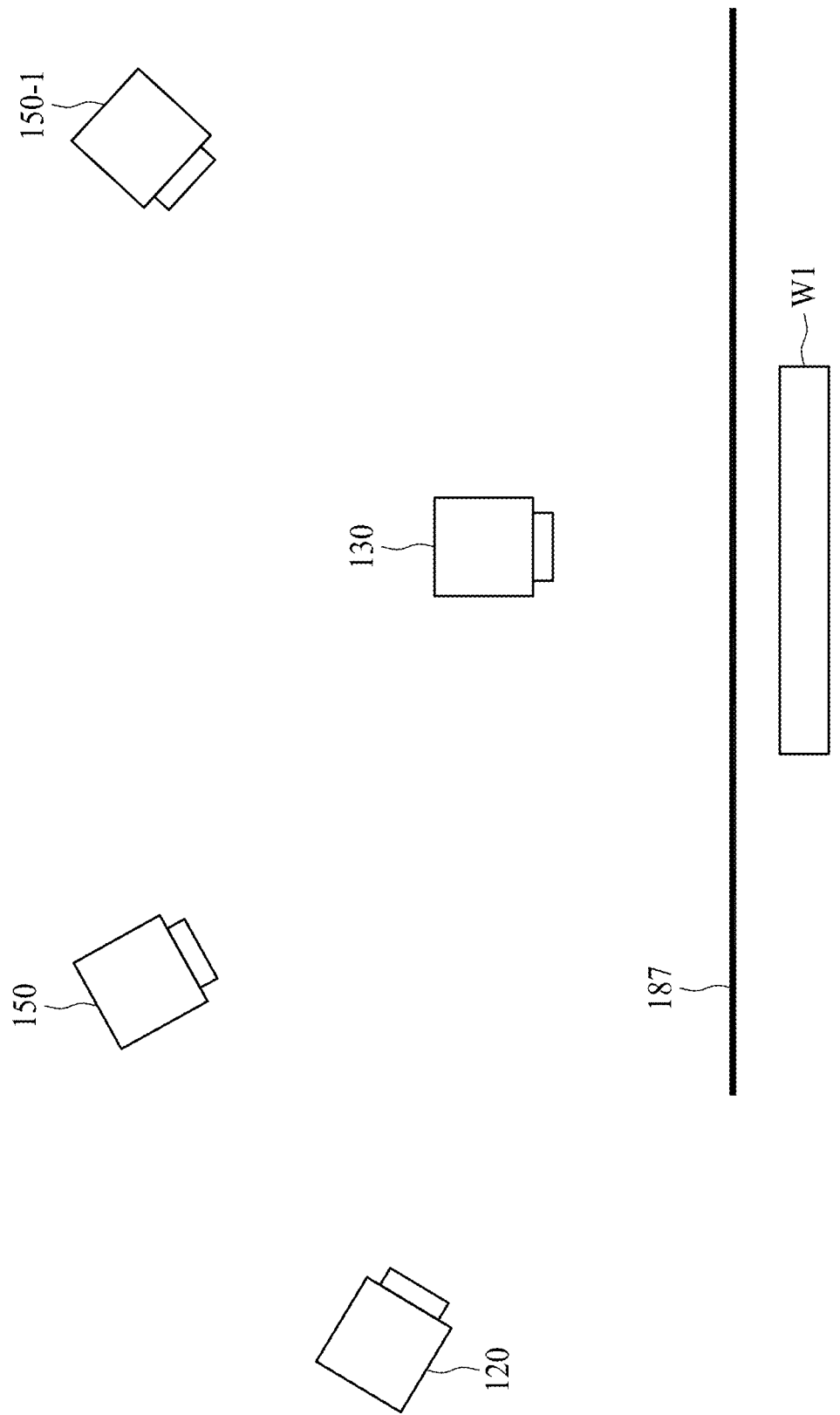
FIG. 9 illustrates a part of the apparatus shown in FIG. 1 and an object to be measured according to some embodiments of the subject application.

FIG. 9 illustrates a part of the apparatus shown in FIG. 1 and the object W1 according to some embodiments of the subject application. FIG. 9 comprises the image capture modules 120 and 130 and the projectors 150 and 150-1. In FIG. 9, the projectors 150 and 150-1 project two different patterns onto the object W1.

Figure 10:
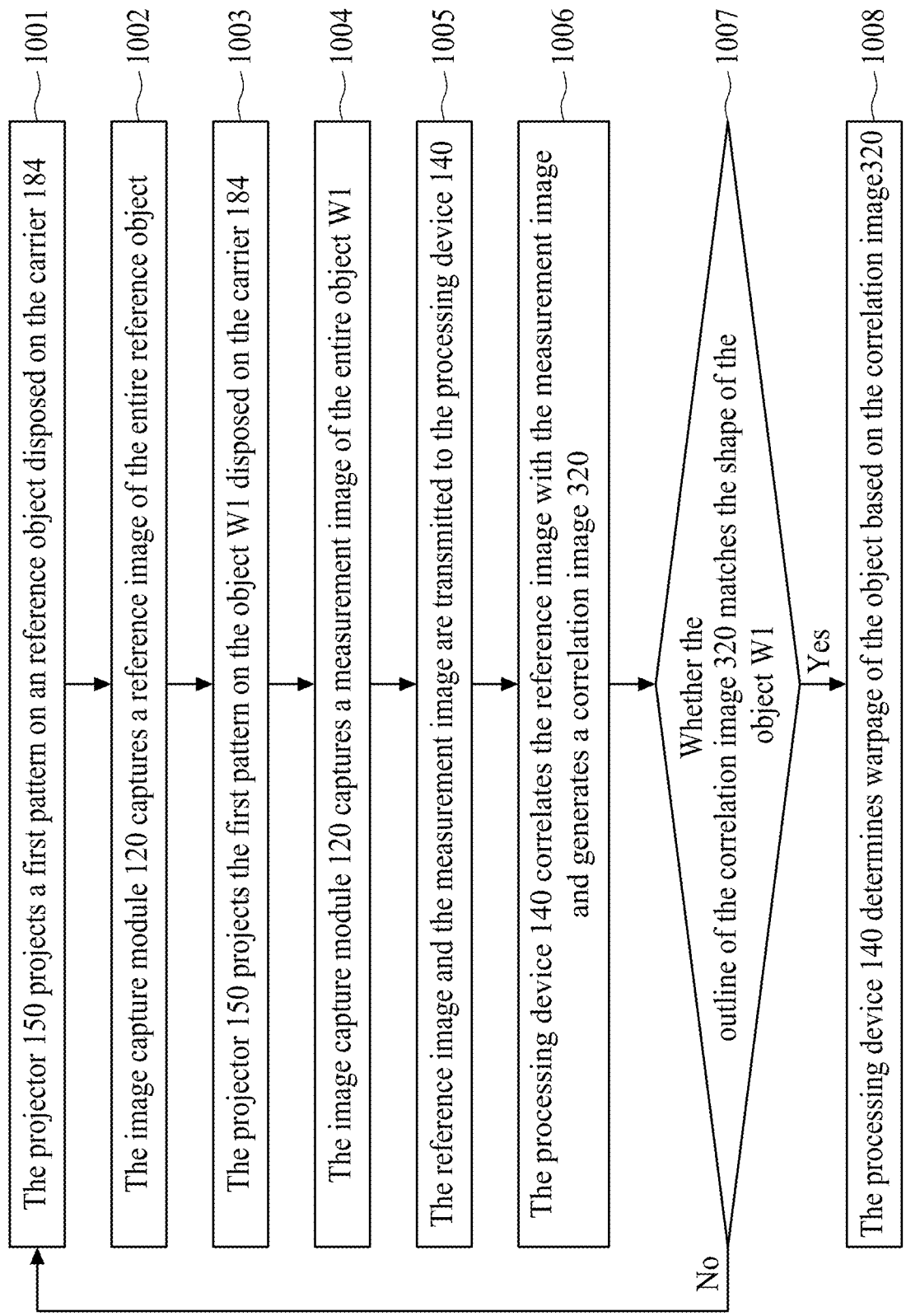
FIG. 10 illustrates various operations for determining warpage of an entire object to be measured according to some embodiments of the subject application.

FIG. 10 illustrates various operations for determining the warpage of the entire object W1 according to some embodiments of the subject application. In operation 1001, the projector 150 projects a first pattern on an entire reference object (e.g., the entire surface of a reference object) disposed on the carrier 184. In operation 1001, the first pattern may be the pattern 210 and covers the entire reference object. The reference object is substantially identical to the object W1 except that it has no warpage or deformation. In operation 1002, the image capture module 120 captures a reference image of the entire reference object. In operation 1003, the projector 150 projects the first pattern on the object W1, which is to be measured and disposed on the carrier 184. The first pattern covers the entire object W1. In operation 1004, the image capture module 120 captures a measurement image of the entire object W1. In operation 1005, the reference image and the measurement image are transmitted to the processing device 140. In operation 1006, the processing device 140 correlates the reference image with the measurement image and generates a correlation image 320 (as shown in FIG. 12B). In operation 1007, the processing device 140 checks whether the outline of the correlation image 320 matches the shape of the object W1. If so (as shown in FIG. 12C), operation 1008 is performed. If not, (as shown in FIG. 13C), the apparatus 100 (e.g., the image capture modules 120 and 130 and the projector 150) should be checked and reconfigured, and operation 1001 is performed. In operation 1008, the processing device 140 determines the warpage of the object W1 based on the correlation image 320.

Figure 11:
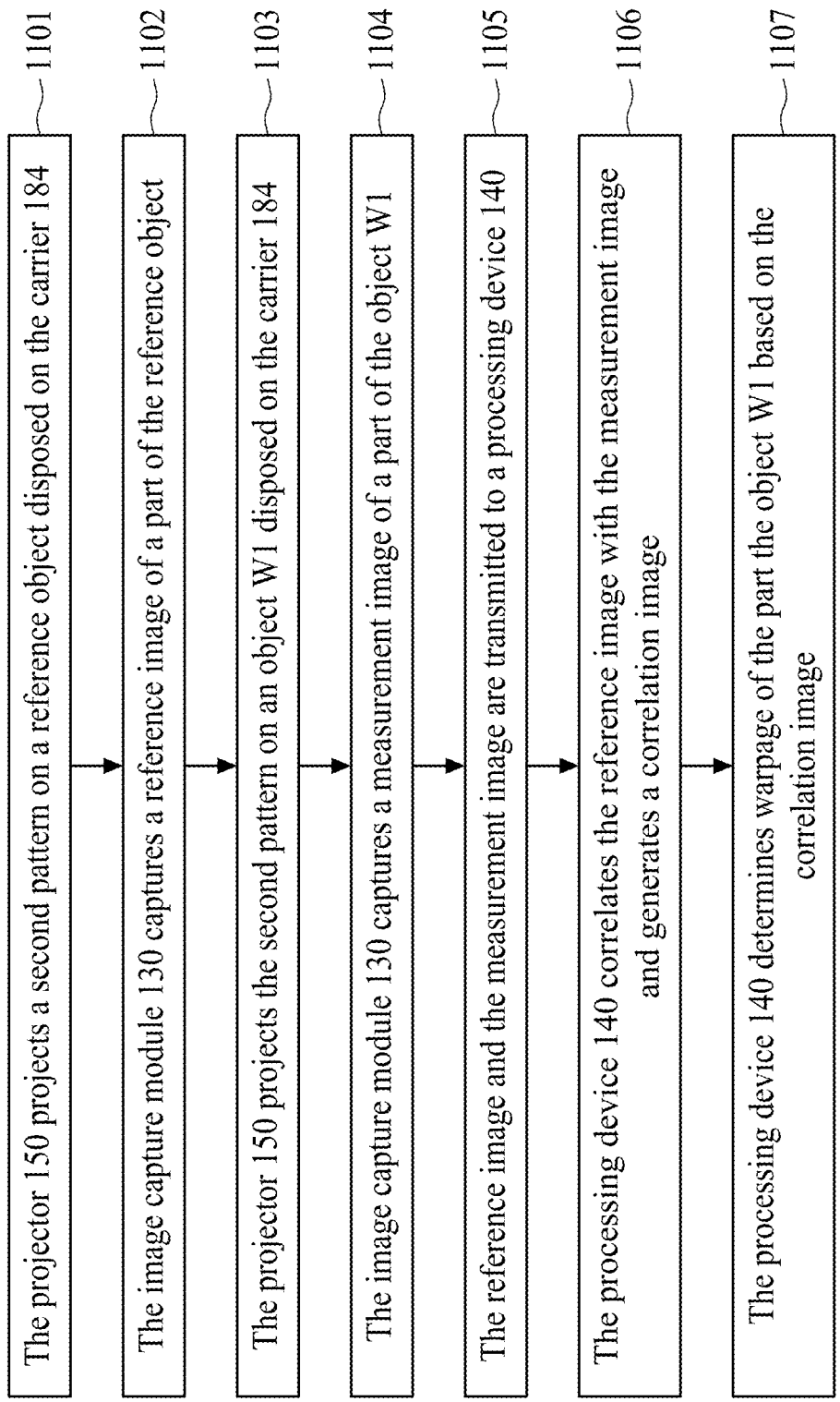
FIG. 11 illustrates various operations for determining warpage of a part of an object to be measured according to some embodiments of the subject application.

FIG. 11 illustrates various operations for determining warpage of a part of the object W1 according to some embodiments of the subject application. In operation 1101, the projector 150 projects a second pattern on a part of a reference object disposed on the carrier 184. In operation 1101, the second pattern may be the pattern 220 and covers the part of the reference object. The reference object is substantially identical to the object W1 except that it has no warpage or deformation. In operation 1102, the image capture module 130 captures a reference image of the part of the reference object. In some embodiments, the part of the reference object occupies one-ninth to one-quarter of the reference image. In operation 1103, the projector 150 projects the second pattern on the object W1, which is to be measured, and disposed on the carrier 184. The second pattern covers a part (e.g., W11, W12, or W13) of the object W1, and the part of the object W1 corresponds to the part of the reference object. In operation 1104, the image capture module 130 captures a measurement image of the part (W11, W12, or W13) of the object W1. The part of the object W1 corresponds to the part of the reference object. In some embodiments, the part of the object W1 occupies one-ninth to one-quarter of the measurement image. In operation 1105, the reference image and the measurement image are transmitted to the processing device 140. In operation 1106, the processing device 140 correlates the reference image with the measurement image and generates a correlation image. In operation 1107, the processing device 140 determines the warpage of the part of the object W1 based on the correlation image.

Figure 12:
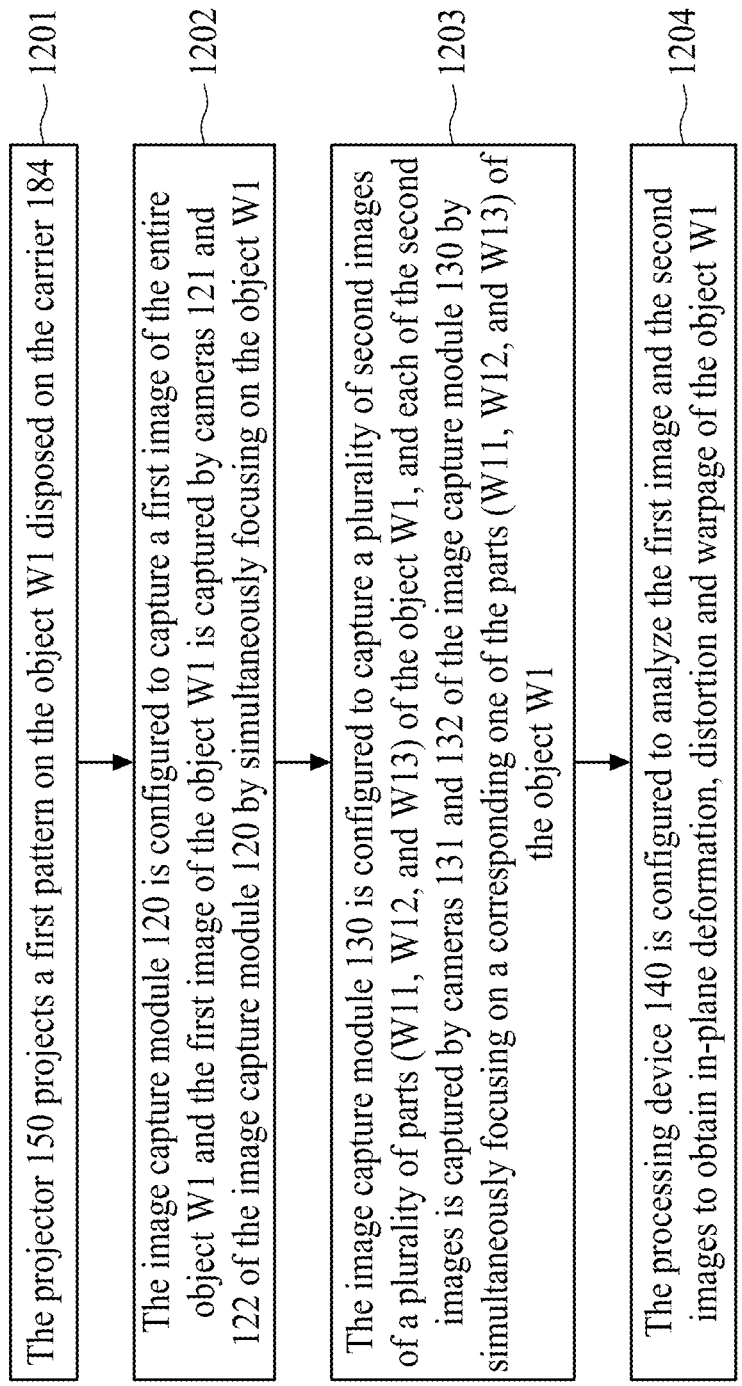
FIG. 12 illustrates various operations for determining in-plane deformation, distortion and warpage of an object to be measured according to some embodiments of the subject application.
Figure 13C:
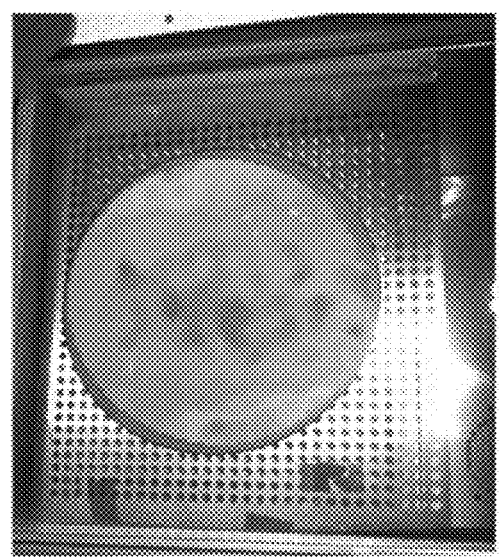
FIG. 13C illustrates a diagram showing the object to be measured and the corresponding correlation image.

FIG. 12 is illustrates various operations for determining in-plane deformation, distortion and warpage of the object W1, according to some embodiments of the subject application. In operation 1201, the projector 150 projects a first pattern on the object W1 disposed on the carrier 184. In operation 1202, the image capture module 120 is configured to capture a first image of the entire object W1, and the first image of the object W1 is captured by cameras 121 and 122 of the image capture module 120 by simultaneously focusing on the object W1. In operation 1203, the image capture module 130 is configured to capture a plurality of second images of a plurality of parts (e.g., W11, W12, and W13) of the object W1, and each of the second images is captured by cameras 131 and 132 of the image capture module 130 by simultaneously focusing on a corresponding one of the parts (e.g., W11, W12, and W13) of the object W1. In operation 1204, the processing device 140 is configured to analyze the first image and the second images to obtain in-plane deformation, distortion and warpage of the object W1.

As shown in FIGS. 1 and 6, the reference object and the object W1 are disposed on the carrier 184 within the temperature-adjustable container 180. The temperature-adjustable container 180 comprises the transparent panel 187 (e.g., a transparent glass panel), and the light from the projector 150 passes through the transparent panel 187 and is projected onto the reference object or the object W1. The reflection of the light from the projector 150 may result in the image capturing modules 120 and 130 capturing unclear images. In some embodiments, an anti-reflection layer may be disposed or coated on the transparent panel 187 to reduce reflection. In some embodiments, the light source of the projector 150 may have a wavelength from approximately 300 nm to approximately 500 nm to reduce reflection.

Figure 13B:
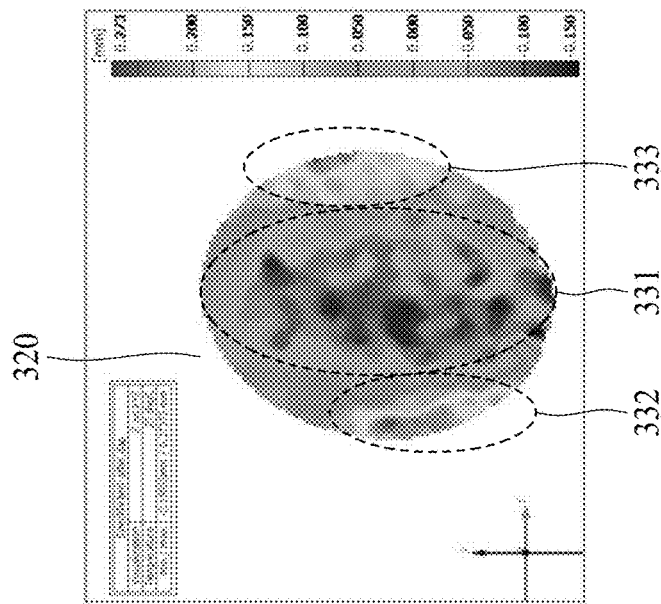
FIG. 13B illustrates a correlation image according to some embodiments of the subject application.
Figure 13A:
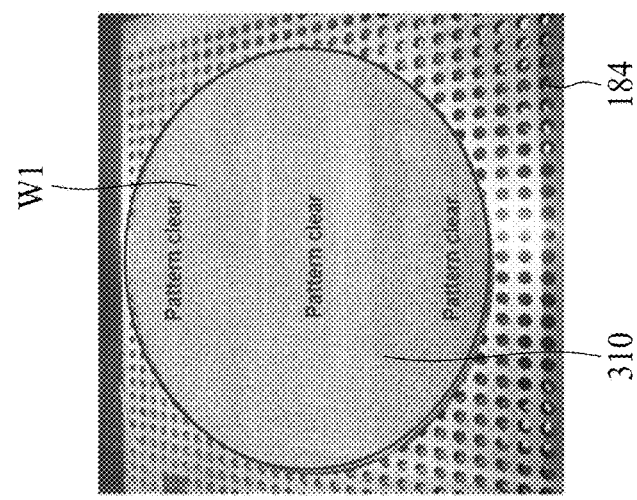
FIG. 13A illustrates a pattern projected on an object to be measured according to some embodiments of the subject application.

FIG. 13A illustrates a pattern 310 projected on the object W1 according to some embodiments of the subject application. In FIG. 13A, the image capture modules 120 and 130 and the projector 150 are configured such that the pattern 310 are clearly projected onto the object W1 and that images are clearly captured. FIG. 13B illustrates a correlation image 320 obtained from the images of the object W1 in FIG. 13A captured by the image capture modules 120 and 130 according to the operations disclosed in FIG. 10. The correlation image 320 shown in FIG. 13B comprises zones 331, 332, and 333. The zone 331 shows that the elevation of this part of the object W1 is lower than the corresponding part of the reference object, and the zones 332 and 333 show that the elevations of these parts of the object W1 are greater than the corresponding parts of the reference object. That is, the correlation image 320 shows the upward warpage (e.g., smiling-shaped warpage) of the object W1. FIG. 13C illustrates a diagram showing the object W1 and the corresponding correlation image. In FIG. 13C, the outline of the correlation image 320 matches the shape of the object W1.

Figure 14C:
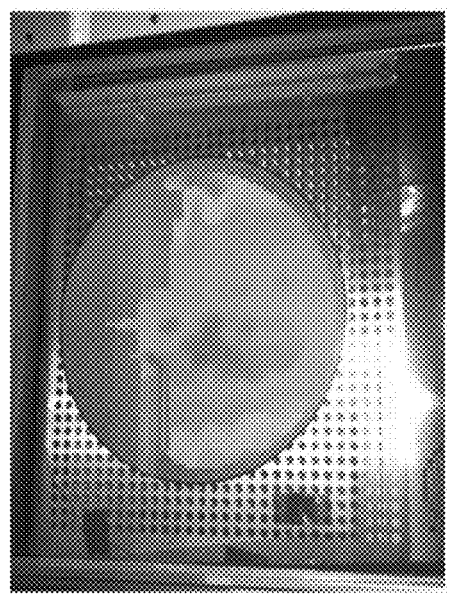
FIG. 14C illustrates a diagram showing the object to be measured and the corresponding correlation image.
Figure 14B:
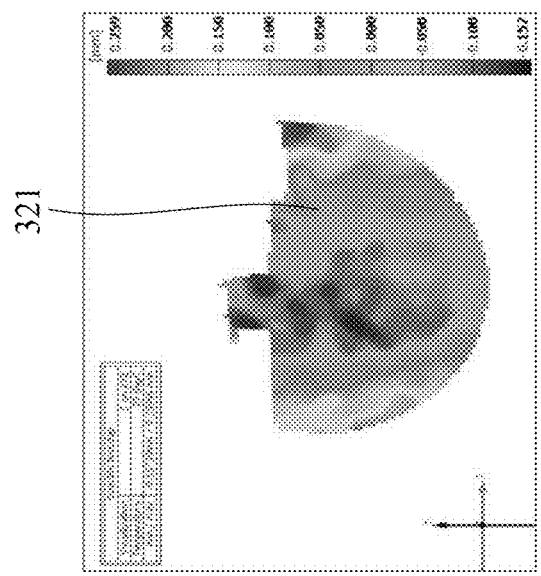
FIG. 14B illustrates a correlation image according to some embodiments of the subject application.
Figure 14A:
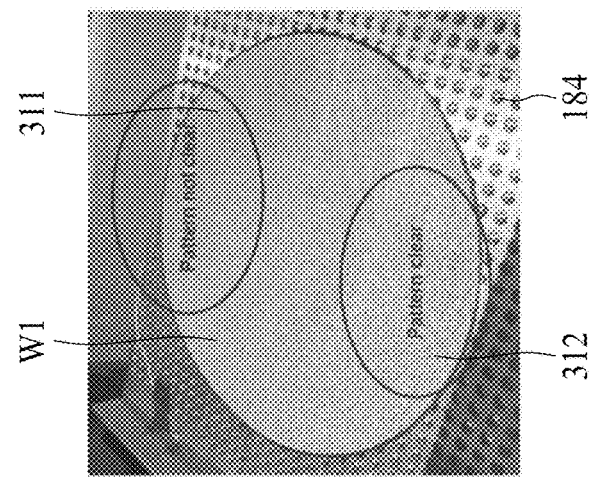
FIG. 14A illustrates a pattern projected on an object to be measured according to some embodiments of the subject application.

FIG. 14A illustrates a pattern projected on the object W1 according to some embodiments of the subject application. In FIG. 14A, there are an unclear pattern zone 311 and a clear pattern zone 312 projected on the object W1. Thus, the images of the object W1 in FIG. 14A are unclear. FIG. 14B illustrates a correlation image 321 obtained from the images of the object W1 in FIG. 13A captured by the image capture modules 120 and 130 according to the operations disclosed in FIG. 10. FIG. 14C illustrates a diagram showing the object W1 and the corresponding correlation image 321. In FIG. 14C, the outline of the correlation image 321 does not match the shape of the object W1, and the apparatus 100 (e.g., the image capture modules 120 and 130 and the projector 150) should be checked and reconfigured such that the unclear pattern zone 311 becomes clear enough and that images are clearly captured.

Figure 15B:
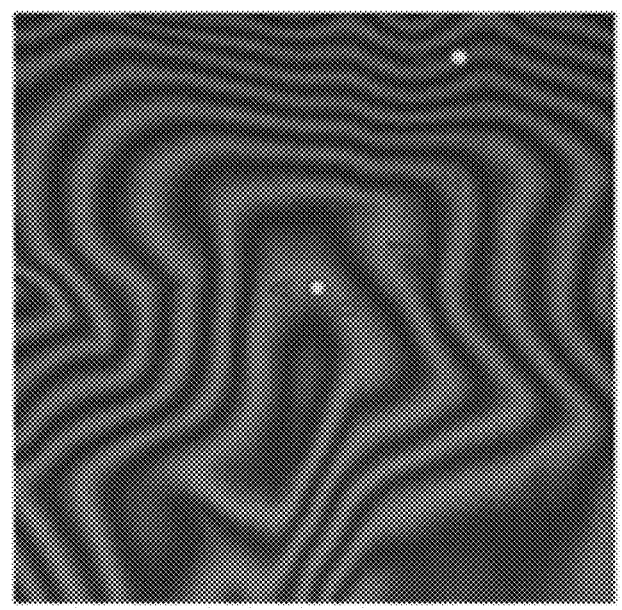
FIG. 15B illustrates a moiré fringe pattern captured by the system shown in FIG. 15A.
Figure 15A:
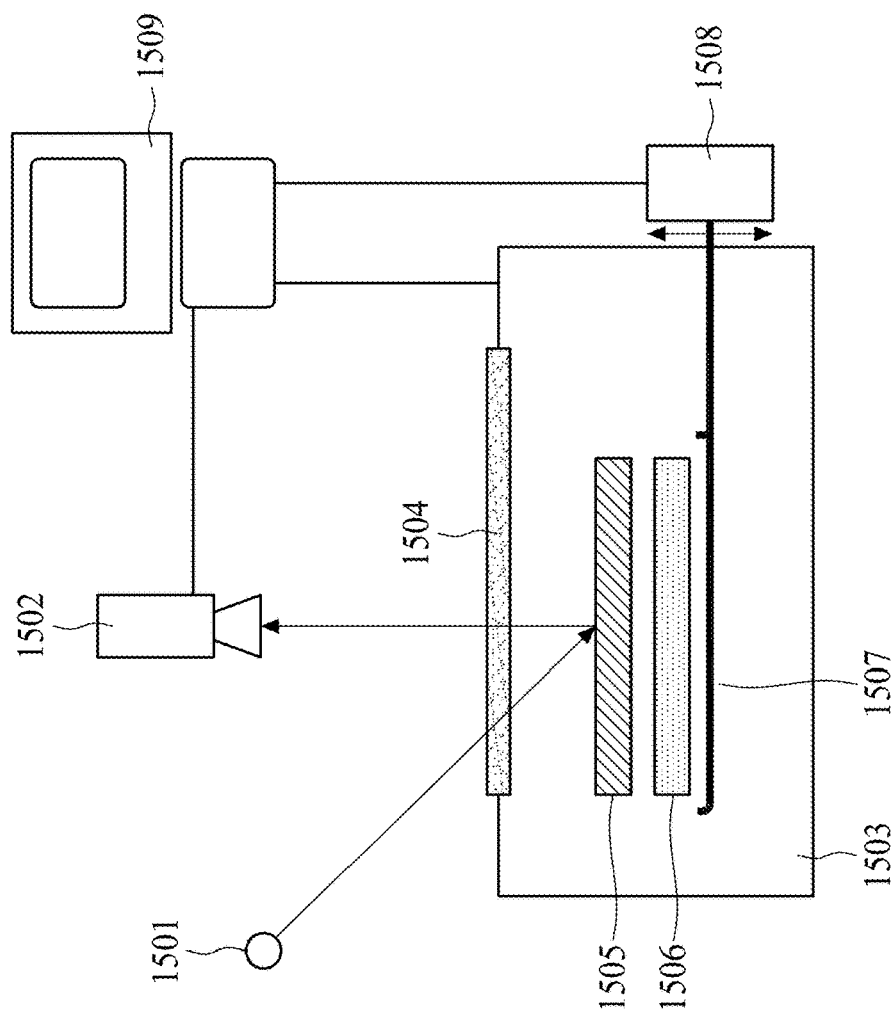
FIG. 15A illustrates a system for measuring warpage using the shadow moiré technique.

FIG. 15A illustrates a system for measuring warpage using the shadow moiré technique. The shadow moiré technique is used to measure deformation and warpage of an object. FIG. 15A shows a light source 1501, an image capture module 1502, a temperature-adjustable container 1503, a transparent panel 1504, a grating 1505, an object 1506 to be measured, a carrier 1507, a linear motor 1508, and a processing device 1509. The light source 1501 emits light. The arrows in FIG. 15A indicate the paths of the light. The light emitted by the light source 1501 passes through the transparent panel 1504 and the grating 1505 and illuminates the object 1506 disposed on the carrier 1507. The linear motor 1508 is configured to move the carrier 1507 along the x-axis, y-axis, and z-axis. Using the shadow moiré technique, the object 1506 should be white or painted white. The image capture module 1502 captures an image of the object 1506 illuminated with the light. The image captured by the image capture module 1502 may include the moiré fringe pattern shown in FIG. 15B. The captured image is transmitted to the processing device 1509 for further analysis. For example, the processing 1509 may analyze the strips 0 to 6 between points A and B as shown in FIG. 15B. The shadow moiré technique is used to measure deformation and warpage of the object 1506 in the z-axis and does not measure the coefficient of thermal expansion (e.g., CTE). Furthermore, it is hard to measure an object larger than 5×5 mm² using the shadow moiré technique.

Figure 16:
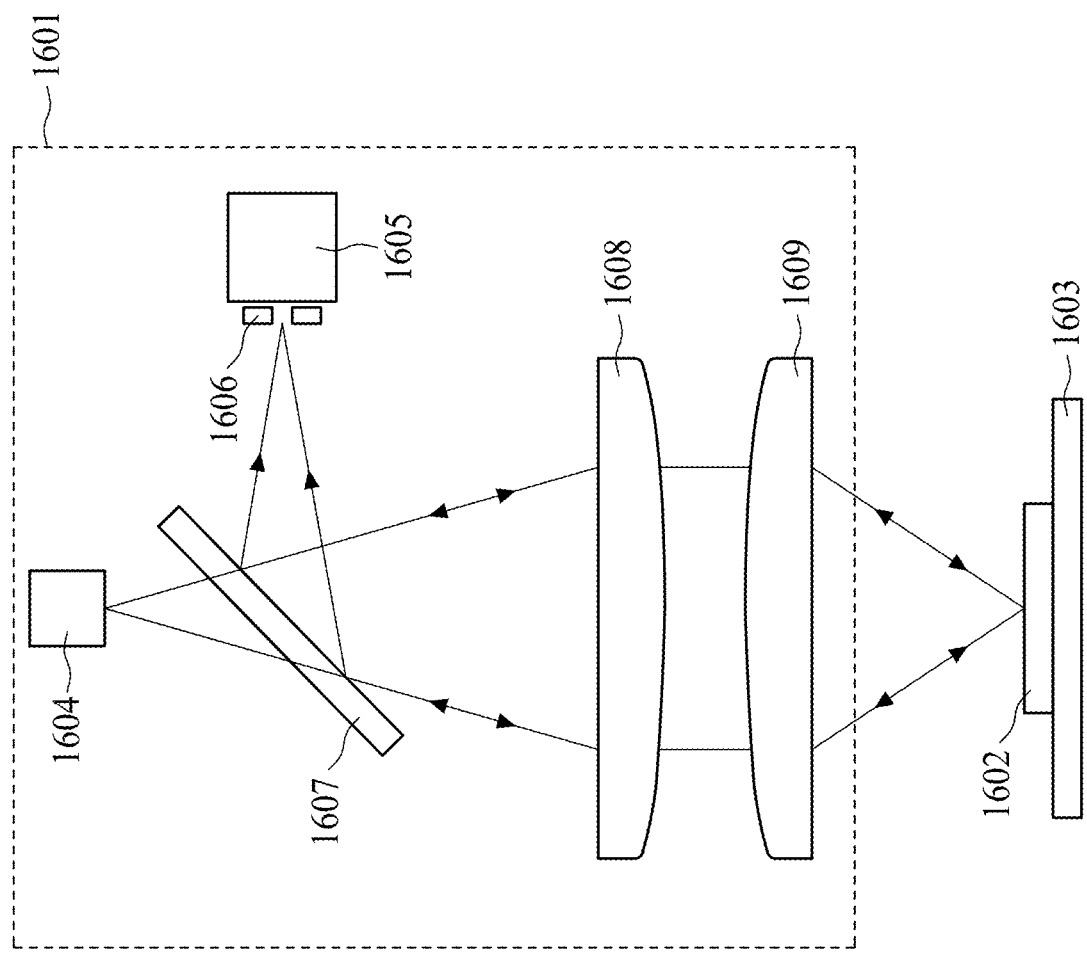
FIG. 16 illustrates a system for measuring warpage using a laser reflection technique.

FIG. 16 illustrates a system for measuring warpage using a laser reflection technique. A laser reflection technique is used to measure deformation and warpage of an object. FIG. 16 shows an apparatus 1601 for measuring warpage and deformation using a laser reflection technique, an object 1602 to be measured, and a carrier 1603 for carrying the object 1602. The apparatus 1601 may be moved with respect to the object 1602 and the carrier 1603. The apparatus 1601 comprises a light source 1604, a light sensor 1605 (including a pinhole 1606), a dichroic mirror 1607, a collimator lens 1608, and an objective lens 1609. The light source 1604 emits a laser beam. The arrows in FIG. 16 indicate the paths of the laser beam. The laser beam emitted by the light source 1604 passes through the dichroic mirror 1607, the collimator lens 1608, and the objective lens 1609, and is reflected by the object 1602 disposed on the carrier 1603. The reflected laser beam passes through the pinhole 1606 and is sensed by the light sensor 1605. Using a laser reflection technique, one point of the object 1602 is measured once. That is, the apparatus 1601 can measure a single point of the object 1602 during one measurement. When measuring warpage and deformation of the object 1602, a reference point is measured by the apparatus 1601, and then the other points are measured one-by-one by the apparatus 1601. Using a laser reflection technique, the measurement is performed at room temperature. The apparatus 1601 measures deformation and warpage of the object 1602 in the z-axis.

Figure 17B:
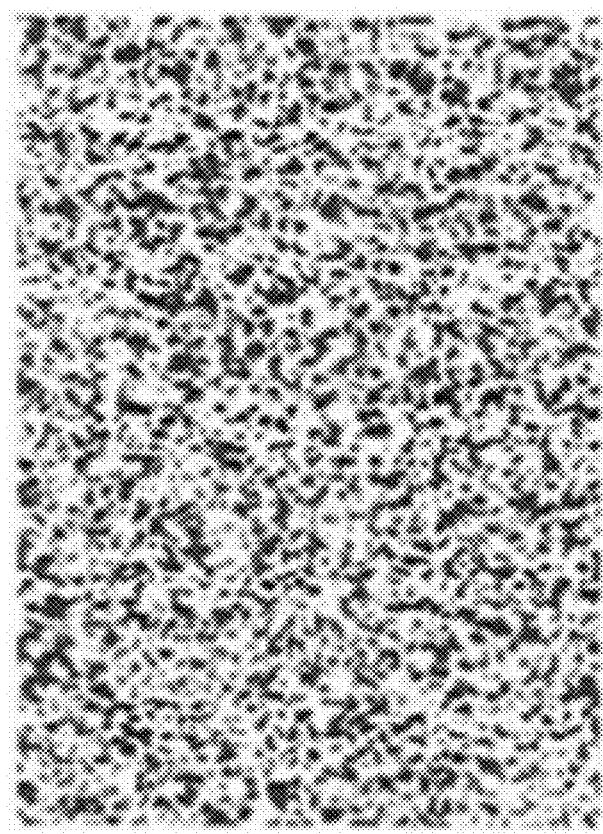
FIG. 17B illustrates an image captured during measurement by the system shown in FIG. 17A.
Figure 17A:
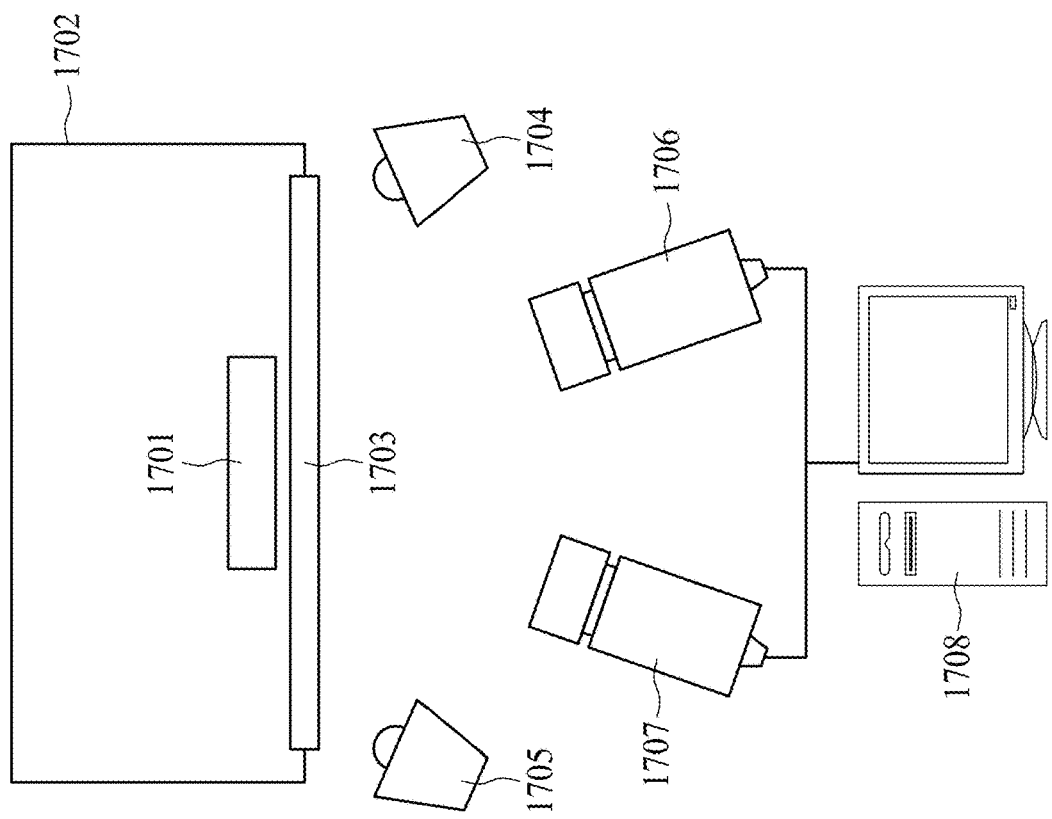
FIG. 17A illustrates a system for measuring warpage using a three-dimensional digital image correlation technique.

FIG. 17A illustrates a system for measuring warpage using a three-dimensional digital image correlation technique. A three-dimensional digital image correlation technique is used to measure deformation and warpage of an object. FIG. 17A comprises an object 1701 to be measured, a temperature-adjustable container 1702, a transparent panel 1703, light sources 1704 and 1705, image capture devices 1706 and 1707, and a processing device 1708. The object 1701 is painted with a high contrast stochastic pattern as shown in FIG. 17B. The light sources 1704 and 1705 provide the light for capturing images. The image capture devices 1706 and 1707 capture different images. The images captured by the image capture devices 1706 and 1707 are transmitted to the processing device 1708. The processing device 1708 correlates the images and then generates a correlation image. The pattern on the object 1701 may remain even if a cleaning operation is performed, which results in contamination that may adversely affect the performance of the semiconductor device package (e.g. poor electrical/thermal conductivity, open circuit, and so forth).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the disclosure has been described and illustrated with reference to specific embodiments thereof, these descriptions and illustrations do not limit the disclosure. It should be understood by those skilled in the art that various changes may be made and equivalents may be substituted without departing from the true spirit and scope of the disclosure as defined by the appended claims. The illustrations may not necessarily be drawn to scale. There may be distinctions between the artistic renditions in the subject application and the actual apparatus, due to manufacturing processes and tolerances. There may be other embodiments of the disclosure which are not specifically illustrated. The specification and the drawings are to be regarded as illustrative rather than restrictive. Modifications may be made to adapt a particular situation, material, composition of matter, method, or process to the objective, spirit and scope of the disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

Moreover, the effects detailed in the above-described embodiments and the like are merely examples. Therefore, the subject application may further have other effects.

What is claimed is:

1. An apparatus, comprising:
a first image capture module having a first axis forming an angle from approximately 70° to approximately 87° with respect to a surface of a carrier;
a second image capture module having a first axis forming an angle of approximately 90° with respect to the surface of the carrier; and
a first projector having a first axis forming an angle from approximately 40° to approximately 85° with respect to the surface of the carrier.

2. The apparatus of claim 1, wherein an object to be disposed on the carrier comprises a wafer, a panel, a strip, or a unit.

3. The apparatus of claim 1, wherein the second image capture module is configured to move in a first direction and a second direction orthogonal to the first direction.

4. The apparatus of claim 2, wherein the first image capture module is configured to capture an image of the entire object.

5. The apparatus of claim 2, wherein the second image capture module is configured to capture an image of a part of the object.

6. The apparatus of claim 1, wherein an elevation of the first image capture module with respect to the carrier is greater than an elevation of the second image capture module with respect to the carrier.

7. The apparatus of claim 1, wherein an elevation of the first projector with respect to the carrier is greater than an elevation of the first image capture module with respect to the carrier.

8. The apparatus of claim 1, wherein the first projector is configured to project a pattern toward the carrier.

9. The apparatus of claim 1, wherein:
the first projector projects a first pattern on a reference object disposed on the carrier;
the first image capture module captures a first reference image of the entire reference object;
the first projector projects the first pattern on an object disposed on the carrier;
the first image capture module captures a first measurement image of the entire object;
the first reference image and the first measurement image are transmitted to a processing device;
the processing device correlates the first reference image with the first measurement image and generates a correlation image; and
the processing device determines warpage of the object based on the correlation image.

10. The apparatus of claim 9, wherein an outline of the correlation image matches the shape of the object.

11. The apparatus of claim 1, wherein:
the first projector projects a first pattern on a reference object disposed on the carrier;
the second image capture module captures a first reference image of a part of the reference object;
the first projector projects the first pattern on an object disposed on the carrier;
the second image capture module captures a first measurement image of a part of the object corresponding to the part of the reference object;
the first reference image and the first measurement image are transmitted to a processing device;
the processing device correlates the first reference image with the first measurement image and generates a correlation image; and
the processing device determines warpage of the part the object based on the correlation image.

12. The apparatus of claim 1, wherein the first projector further comprises a light source to emits a light beam having wavelength from approximately 300 nm to approximately 500 nm.

13. The apparatus of claim 1, wherein the carrier is disposed in a temperature-adjustable container, and the temperature-adjustable container comprises a transparent panel over the carrier.

14. The apparatus of claim 9, wherein:
the first image capture module is configured to capture a first image of the entire object, the first image of the object is captured by cameras of the first image capture module by simultaneously focusing on the object;
the second image capture module is configured to capture a plurality of second images of a plurality of parts of the object, and each of the second images is captured by cameras of the first image capture module by simultaneously focusing on a corresponding one of the parts of the object; and
the processing device is configured to analyze the first image and the second images to obtain in-plane deformation, distortion and warpage of the object.

15. An apparatus, comprising:
a first projector having a first projection range;
a first image capture module disposed out of the first projection range of the first projector and having a first field of view; and
a second image capture module disposed out of the first field of view of the first image capture module and out of the first projection range of the first projector, wherein an elevation of the first projector with respect to a carrier is greater than an elevation of the first image capture module with respect to the carrier, and the elevation of the first image capture module with respect to the carrier is greater than an elevation of the second image capture module with respect to the carrier.

16. The apparatus of claim 15, wherein an object to be disposed on the carrier comprises a wafer, a panel, a strip, or a unit.

17. The apparatus of claim 15, wherein the second image capture module is configured to move in a first direction and a second direction orthogonal to the first direction.

18. The apparatus of claim 16, wherein the first image capture module is configured to capture an image of the entire object.

19. The apparatus of claim 16, wherein the second image capture module is configured to capture an image of a part of the object.

20. The apparatus of claim 15, wherein:
the first projector projects a first pattern on a reference object disposed on the carrier;
the first image capture module captures a first reference image of the entire reference object;
the first projector projects the first pattern on an object disposed on the carrier;
the first image capture module captures a first measurement image of the entire object;
the first reference image and the first measurement image are transmitted to a processing device;
the processing device correlates the first reference image with the first measurement image and generates a correlation image; and
the processing device determines the warpage of the object based on the correlation image.

21. The apparatus of claim 15, wherein:
the first projector projects a first pattern on a reference object disposed on the carrier;
the second image capture module captures a first reference image of a part of the reference object;
the first projector projects the first pattern on an object disposed on the carrier;
the second image capture module captures a first measurement image of a part of the object corresponding to the part of the reference object;
the first reference image and the first measurement image are transmitted to a processing device;
the processing device correlates the first reference image with the first measurement image and generates a correlation image; and
the processing device determines the warpage of the object based on the correlation image.

22. The apparatus of claim 15, wherein the first projector further comprises a light source to emits a light beam having wavelength from approximately 300 nm to approximately 500 nm.

23. The apparatus of claim 15, wherein the carrier is disposed in a temperature-adjustable container, and the temperature-adjustable container comprises a transparent panel over the carrier.

24. A method for measuring an object, comprising:
projecting a first pattern on a reference object disposed on a carrier using a first projector;
capturing a first reference image of the entire reference object using a first image capture module;
projecting the first pattern on an object disposed on the carrier using the first projector;
capturing a first measurement image of the entire object using the first image capture module;
correlating the first reference image with the first measurement image and generating a global correlation image;
projecting a second pattern on the reference object disposed on the carrier using the first projector;
capturing a second reference image of a part of the reference object using a second image capture module;
projecting the second pattern on the object disposed on the carrier using the first projector;
capturing a second measurement image of a part of the object corresponding to the part of the reference object using the second image capture module;
correlating the second reference image with the second measurement image and generating a local correlation image; and
determining the warpage of the object based on the global correlation image and the warpage of the part of the object based on the local correlation image,
wherein an elevation of the first projector with respect to the carrier is greater than an elevation of the first image capture module with respect to the carrier, and the elevation of the first image capture module with respect to the carrier is greater than an elevation of the second image capture module with respect to the carrier.

25. The method of claim 24, wherein an outline of the global correlation image matches the shape of the object.

26. The method of claim 24, wherein a second projector projects the second pattern different from the first pattern.

27. The method of claim 24, further comprising:
capturing a first image of the entire object using the first image capture module comprising multiple cameras disposed at different positions relative to the object for analyzing an entire deformation of the entire object, wherein the first image of the entire object is captured by the cameras of the cameras of the first image capture module by simultaneously focusing on the object;
capturing a plurality of second images of a plurality of parts of the object using the second image capture module comprising multiple cameras disposed at different positions relative to the object for analyzing a plurality of local deformations of the parts of the object, wherein each of the second images are captured by the cameras of the second image capture module by simultaneously focusing on a corresponding one of the parts of the object; and
analyzing the first image and the second images to obtain in-plane deformation, distortion and warpage of the object.

* * * * *